United States Patent
Choi et al.

(10) Patent No.: US 11,658,351 B2
(45) Date of Patent: May 23, 2023

(54) WIRELESS BATTERY MANAGEMENT SYSTEM, NODE FOR WIRELESS COMMUNICATION, AND METHOD OF ASSIGNING SLOT

(71) Applicant: SILICON WORKS CO., LTD., Daejeon (KR)

(72) Inventors: Seung Jun Choi, Daejeon (KR); Heung Lyeol Lee, Daejeon (KR); Ju Pyo Hong, Daejeon (KR); Deog Soo Kim, Daejeon (KR); Young Ho Seo, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 396 days.

(21) Appl. No.: 16/944,339

(22) Filed: Jul. 31, 2020

(65) Prior Publication Data
US 2021/0043983 A1 Feb. 11, 2021

(30) Foreign Application Priority Data

Aug. 5, 2019 (KR) .................. 10-2019-0095219
Jul. 2, 2020 (KR) .................. 10-2020-0081775

(51) Int. Cl.
*H01M 10/42* (2006.01)
*G01R 31/36* (2020.01)
(Continued)

(52) U.S. Cl.
CPC .... *H01M 10/4257* (2013.01); *G01R 31/3648* (2013.01); *G01R 31/371* (2019.01);
(Continued)

(58) Field of Classification Search
CPC .............. G01R 31/3648; G01R 31/371; G01R 31/396; H01M 10/425; H01M 10/4257;
(Continued)

(56) References Cited

U.S. PATENT DOCUMENTS 8,503,343 B2      8/2013   Kawakami et al.
2019/0378390 A1*  12/2019  Bergqvist .......... G08B 13/2417
2020/0036194 A1    1/2020  Park et al.

FOREIGN PATENT DOCUMENTS

CN      106384850 A    *  2/2017  ............ G01R 31/36
KR    10-2019-0040414 A    4/2019

OTHER PUBLICATIONS

Machine translation CN106384850A (Year: 2017).*

* cited by examiner

*Primary Examiner* — Victoria H Lynch
(74) *Attorney, Agent, or Firm* — Harness, Dickey & Pierce, P.L.C.

(57) ABSTRACT

Disclosed are a wireless battery management system, a node for wireless communication, and a method of assigning slot, which respectively assign dedicated slots having different time intervals to monitor nodes to support smooth and stable communication between the monitor nodes and a manager node. The wireless battery management system includes a manager node checking number of monitor nodes joining in a short-range wireless network for battery management, dividing a transmission slot, assigned for data transmission, by the number of monitor nodes to generate a plurality of dedicated slots, and respectively assigning the plurality of dedicated slots to the monitor nodes and a monitor node collecting battery data and transmitting the collected battery data to the manager node during an assigned dedicated slot.

14 Claims, 11 Drawing Sheets

(51) Int. Cl.
    *G01R 31/371*     (2019.01)
    *H04L 67/104*     (2022.01)
    *H04W 74/08*     (2009.01)
    *H04W 4/80*     (2018.01)
    *H04W 88/08*     (2009.01)
    *H04W 84/18*     (2009.01)
    *H04W 4/70*     (2018.01)
    *H04W 72/0446*     (2023.01)
    *H04W 4/08*     (2009.01)
    *H04W 8/26*     (2009.01)

(52) U.S. Cl.
    CPC ....... *H04L 67/1046* (2013.01); *H04W 74/085* (2013.01); *H01M 2010/4271* (2013.01); *H01M 2010/4278* (2013.01); *H04W 4/08* (2013.01); *H04W 4/70* (2018.02); *H04W 4/80* (2018.02); *H04W 8/26* (2013.01); *H04W 72/0446* (2013.01); *H04W 84/18* (2013.01); *H04W 88/085* (2013.01)

(58) Field of Classification Search
    CPC .. H01M 2010/4271; H01M 2010/4278; H04L 67/1046; H04W 4/08; H04W 4/70; H04W 4/80; H04W 52/0216; H04W 52/0219; H04W 52/0238; H04W 72/0446; H04W 74/04; H04W 74/085; H04W 8/26; H04W 84/18; H04W 88/085; Y02D 30/70; Y02E 60/10
    See application file for complete search history.

WIRELESS BATTERY MANAGEMENT SYSTEM, NODE FOR WIRELESS COMMUNICATION, AND METHOD OF ASSIGNING SLOT

CROSS-REFERENCE TO RELATED APPLICATIONS

This application claims the benefit of the Korean Patent Application No. 10-2019-0095219 filed on Aug. 5, 2019 and No. 10-2020-0081775 filed on Jul. 2, 2020, which is hereby incorporated by reference as if fully set forth herein.

FIELD

The present disclosure relates to a wireless battery management system, and more particularly, to a wireless battery management system which smoothly and stably performs wireless communication to collect battery data, a node for wireless communication, and a method of assigning slot.

BACKGROUND

As the demand for portable electronic products such as notebook computers, video cameras, and portable phones increases rapidly and electric vehicles, storage batteries for storing energy, robots, and satellites are really developed, research on high-performance batteries capable of being repeatedly charged and discharged is being actively done.

A minimum unit of each battery may be referred to as a battery cell, and a plurality of battery cells serially connected to one another may configure a battery module. Also, a plurality of battery modules may be connected to one another in series or parallel, and thus, may configure a battery pack.

Generally, a battery pack equipped in electric vehicles and the like includes a plurality of battery modules connected to one another in series or parallel. The battery pack includes a battery management system which monitors a state of each of the battery modules and executes a control operation corresponding to the monitored state.

The battery management system includes a controller for obtaining and analyzing battery data. However, each of the battery modules included in the battery pack includes a plurality of battery cells, and due to this, there is a limitation in monitoring states of all of the battery cells included in the battery pack by using a single controller. Therefore, a method, where a controller is equipped in each of a certain number of battery modules included in a battery pack, one of the controllers is set as a master, and the other controllers are set as slaves, is being recently used for distributing a load of a controller and quickly and accurately monitoring a whole state of a battery pack.

A slave controller equipped in each of a certain number of battery modules is connected to a master controller over a wired communication network such as a control area network (CAN), collects battery data of a battery module controlled by the slave controller, and transmits the battery data to the master controller.

Technology, which sets a short-range wireless channel between the master controller and the slave controller and performs short-range wireless communication between the master controller and the slave controller, has been proposed for preventing the non-efficiency of a space occurring in a case where the CAN is built for communication between the master controller and the slave controller.

A battery management system includes one master controller and a plurality of slave controllers, and the plurality of slave controllers periodically transmit battery data to the master controller. However, in a case where the one master controller communicates with the plurality of slave controllers through short-range wireless communication, wireless channel contention or a transmission collision between the slave controllers occurs, causing a problem where a data transmission error such as the loss or delay of battery data occurs.

SUMMARY

Accordingly, the present disclosure is directed to providing a wireless battery management system, a node for wireless communication, and a method of assigning slot that substantially obviate one or more problems due to limitations and disadvantages of the related art.

An aspect of the present disclosure is directed to providing a wireless battery management system, a node for wireless communication, and a method of assigning slot, which respectively assign dedicated slots having different time intervals to monitor nodes to support smooth and stable communication between the monitor nodes and a manager node.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a wireless battery management system including: a manager node checking number of monitor nodes joining in a short-range wireless network for battery management, dividing a transmission slot, assigned for data transmission, by the number of monitor nodes to generate a plurality of dedicated slots, and respectively assigning the plurality of dedicated slots to the monitor nodes; and a monitor node collecting battery data and transmitting the collected battery data to the manager node during an assigned dedicated slot.

In another aspect of the present disclosure, there is provided a manager node including: a wireless communication unit forming a short-range wireless network along with a plurality of monitor nodes; and a manager controller dividing a transmission slot, assigned for data transmission, by number of monitor nodes to generate a plurality of dedicated slots, respectively assigning the plurality of dedicated slots to the monitor nodes, and transmitting information about an assigned dedicated slot to a corresponding monitor node by using the wireless communication unit.

In another aspect of the present disclosure, there is provided a monitor node including: a wireless communication unit receiving a message, issuing a request to join in a short-range wireless network, from a manager node; and a monitor controller generating a delay time, transmitting a join response to the manager node by using the wireless communication unit after the delay time elapses, and checking assignment information received from the manager node to set a dedicated slot for battery data transmission.

In another aspect of the present disclosure, there is provided a method of assigning a slot to each of monitor nodes joining in a short-range wireless network in a wireless battery management system, the method including: checking number of monitor nodes joining in the short-range wireless network; dividing a transmission slot, assigned for data transmission, by the number of monitor nodes to generate a plurality of dedicated slots equal to the number of monitor nodes; and respectively assigning the generated plurality of dedicated slots to the monitor nodes; and receiving battery data from a corresponding monitor node during an assigned dedicated slot.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
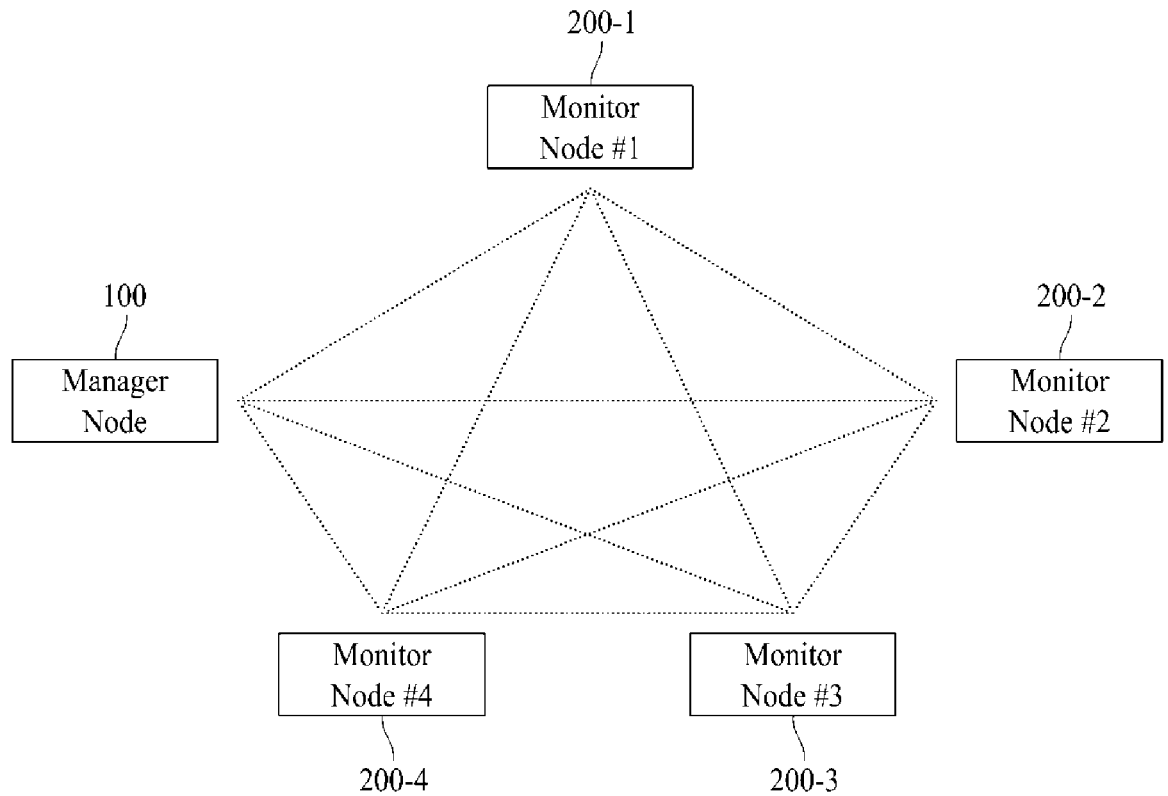
FIG. 1 is a diagram illustrating a wireless battery management system according to an embodiment of the present disclosure.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a time relationship, for example, when the temporal order is described as 'after~', 'subsequent~', 'next~', 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

FIG. 1 is a diagram illustrating a wireless battery management system according to an embodiment of the present disclosure.

As illustrated in FIG. 1, the wireless battery management system according to an embodiment of the present disclosure may include a manager node 100 and a plurality of monitor nodes 200-N, and the manager node 100 and each of the monitor nodes 200-N may perform wireless communication therebetween.

In the wireless battery management system according to an embodiment, the manager node 100 may include a controller set as a master, and each of the monitor nodes 200-N may include a controller set as a slave.

In an embodiment, the manager node 100 and each of the monitor nodes 200-N may perform wireless communication therebetween according to a short-range wireless communication protocol based on IEEE 802.15.4+. In another embodiment, the manager node 100 and each of the monitor nodes 200-N may perform wireless communication therebetween according to a protocol based on one of IEEE 802.11, IEEE 802.15, and IEEE 802.15.4, or may perform wireless communication therebetween according to a short-range wireless protocol based on another scheme.

Each of the monitor nodes 200-N may be equipped in one or more battery modules each including a set of cells and may collect battery data including a voltage, a current, a temperature, humidity, and the like occurring in the battery module. Also, each of the monitor nodes 200-N may autonomously inspect a state of a battery module equipped with a corresponding monitor node by measuring an analog front end (AFE) of the battery module and inspecting a state (i.e., diagnostic test) of the battery module, thereby generating a self-diagnosis data including an inspection result.

The manager node 100 may receive battery data, including one or more of a current, a voltage, a temperature, and self-diagnosis data, from each of the monitor nodes 200-N and may analyze the received battery data to monitor a state of each battery module or a state of a battery pack. The manager mode 100 may analyze data of each battery module received from each of the monitor nodes 200-N to estimate the state (for example, state of charge (SOC) and state of health (SOH)) of each battery module and a whole state of the battery pack.

According to an embodiment of the present disclosure, the manager node 100 may form a short-range wireless network for battery management. Also, the manager node 100 may check the number of monitor nodes 200-N joining in the short-range wireless network and may equally divide a transmission slot (see a transmission slot of FIG. 2) by the number of monitor nodes 200-N to generate one or more dedicated slots. The transmission slot may be a period which is assigned for data transmission by a plurality of monitor nodes, and the dedicated slot may be a period which is assigned to one monitor node and is available by only a single monitor node. Also, the short-range wireless network may be a personal network formed based on the manager node 100, and a monitor node 200-N joining in the short-range wireless network may perform short-range wireless communication with the manager node 100. The number of monitor nodes 200-N joining in the short-range wireless network may be the same as the number of monitor nodes 200-N which are performing short-range wireless communication with the manager node 100.

The manager node 100 may assign a dedicated slot and a communication identification (ID) to each monitor node 200-N. The communication ID may be identification information used for only a short-range wireless network and may be managed by the manager node 100. The manager node 100 may communicate with the monitor nodes 200-N by using a data frame having a predefined format.

Figure 2:
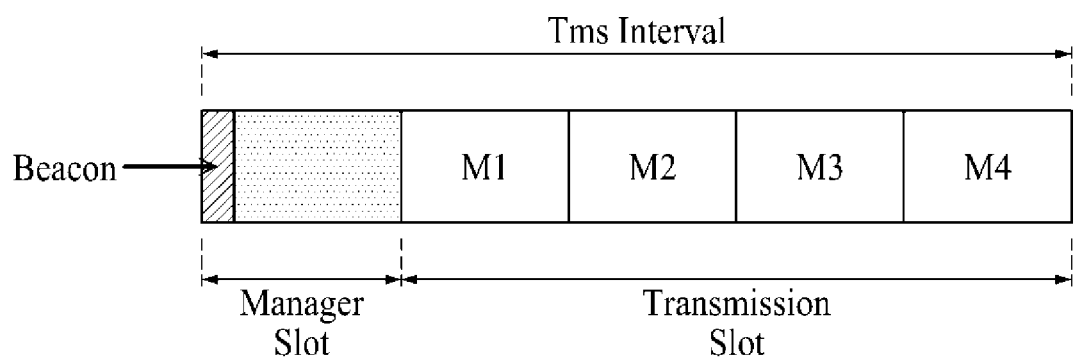
FIG. 2 is a diagram illustrating a data frame according to an embodiment of the present disclosure.

FIG. 2 is a diagram illustrating a data frame according to an embodiment of the present disclosure.

Referring to FIG. 2, a data frame used for wireless communication according to the present disclosure may include a plurality of time slots including a manager slot and a transmission slot and may have a certain time length Tms. A predetermined time section may be allocated to the manager slot and the transmission slot of the data frame, and an arrangement order of the manager slot and the transmission slot may be constant. In the data frame, a first-arranged manager slot may be a dedicated slot used for the manager node 100 and may include a beacon.

The beacon may perform a function of notifying the start of the data frame, and thus, may synchronize a slot timing. The manager node 100 may continuously transmit the beacon at a certain periodic interval. Each of the monitor nodes 200-N may recognize a start time of the data frame on the basis of the beacon and may extract the manager slot and the transmission slot each having a previously-allocated time from the data frame on the basis of the beacon.

A manager slot in the data frame may be a slot which is used for the manager node 100 controlling the monitor nodes 200-N. During the manager slot, assignment information including a communication ID and dedicated slot information may be transmitted to the monitor nodes 200-N.

The transmission slot may be a time slot where battery data is transmitted and may be divided into a plurality of dedicated slots so as to be respectively assigned to the monitor nodes 200-N. The transmission slot may be equally divided into slots equal to the number of monitor nodes (which is communicating with a current manager node) joining in the short-range wireless network, and a divided transmission slot (i.e., a dedicated slot) may be assigned for a specific monitor node 200-N. In FIG. 2, it is illustrated that a transmission slot may be divided into four periods, and in this case, M1 may be a monitor node #1 200-1, M2 may be a monitor node #2 200-2, M3 may be a monitor node #3 200-3, and M4 may be a monitor node #4 200-4.

Information about each of time slots included in the data frame may be previously stored in each of the monitor node 200-N and the manager node 100. For example, in a process of releasing a product, a slot length of the data frame, a length of the manager slot, and a length of the transmission slot may be previously stored in each of the monitor node 200-N and the manager node 100.

When identification information and a message issuing a request to join in a network are received from the manager node 100, a monitor node 200-N may provide its own identification information (for example, a medium access control (MAC) address) in response thereto, thereby joining in a short-range wireless network. At this time, the monitor node 200-N may substitute its own identification information (for example, an MAC address) as a seed into a random number generator to generate a delay time which differs from another monitor node 200-N, and when the delay time elapses, the monitor node 200-N may provide the identification information to the manager node 100, thereby joining in the short-range wireless network. Also, when the monitor node 200-N receives assignment information including a communication ID and dedicated slot information, the monitor node 200-N may set the communication ID to an ID thereof and may set a period, corresponding to the dedicated slot information, to a dedicated slot for transmission of battery data. The monitor node 200-N may collect sensing information (for example, a temperature, humidity, a voltage, a current, etc.) about one or more battery modules equipped with the monitor node 200-N and one or more pieces of battery data included in a diagnostic test result and may report the collected battery data to the manager node 100 during the dedicated slot.

Figure 3:
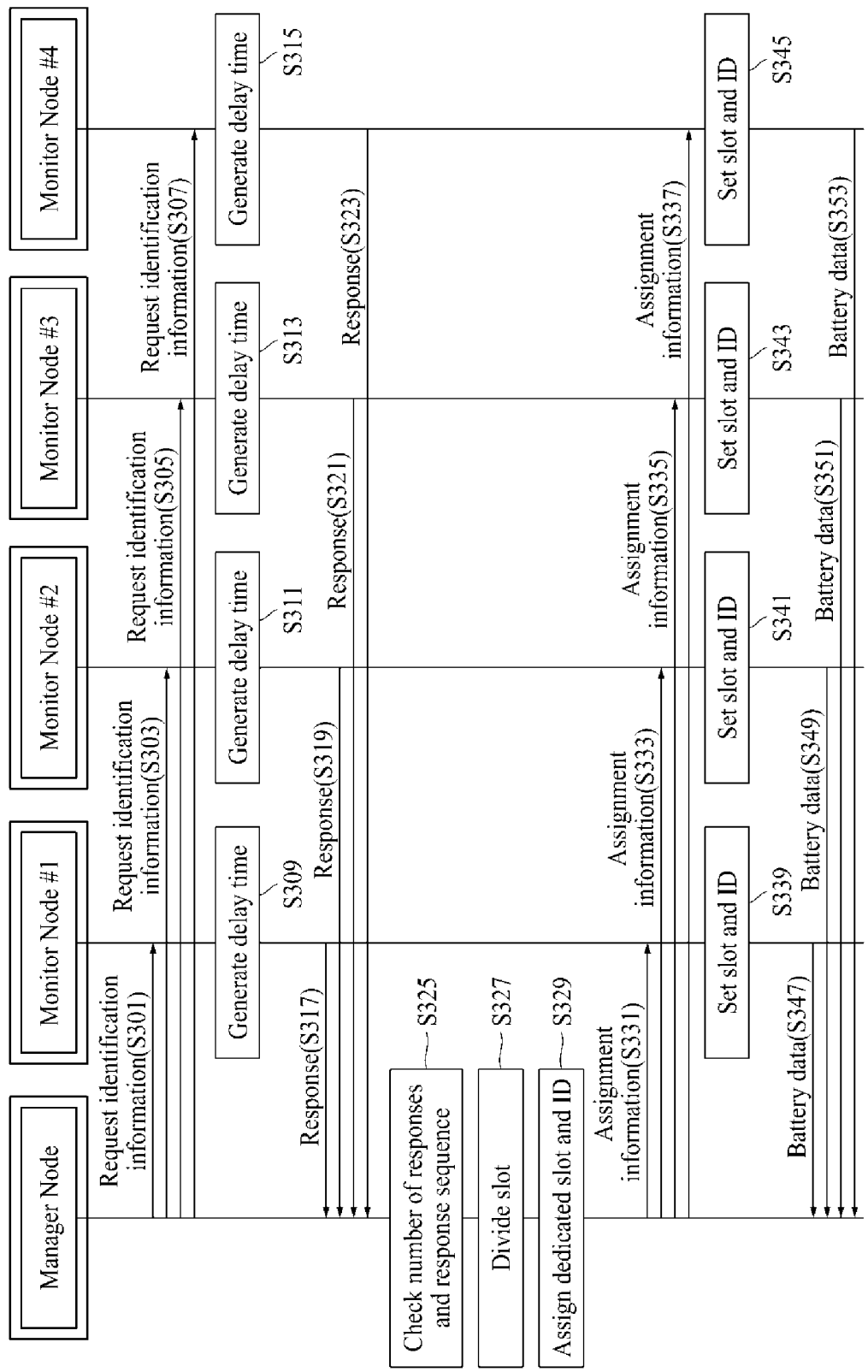
FIG. 3 is a flowchart describing a method of assigning a dedicated slot of each monitor node in a wireless battery management system, according to an embodiment of the present disclosure.

FIG. 3 is a flowchart describing a method of assigning a dedicated slot of each monitor node in a wireless battery management system, according to an embodiment of the present disclosure.

In the embodiment of FIG. 3, an example where a short-range wireless network is initially formed will be described.

Referring to FIG. 3, when power is turned on or an input for forming a network is received, a manager node 100 may broadcast a message requesting identification information on the basis of short-range wireless communication, for allowing peripheral monitor nodes 200-N to join in a short-range wireless network in operations S301, S303, S305, and S307. The manager node 100 may transmit the message during a manager slot of a data frame.

The monitor node #1 200-1, the monitor node #2 200-2, the monitor node #3 200-3, and the monitor node #4 200-4 may respectively input their own identification information as a seed to the random number generator to generate different delay times in operations S309, S311, S313, and S315. The random number generator may be implemented so that, when identification information (for example, an MAC address) about a monitor node 200-N is input thereto, an arbitrary time (i.e., a delay time) of a total period of a transmission slot is output. For example, in a case where a time length of a transmission period is 80 ms, when the identification information about the monitor node 200-N is input, the random number generator may output, as a result, one of natural numbers of 1 to 80, and the monitor node 200-N may use, as a delay time, a result output from the random number generator. Also, a plurality of monitor nodes 200-N may be selected and may be applied to the wireless batter management system, so that result values (i.e., delay times) of the random number generator do not overlap with each other. That is, each monitor node 200-N applied to an embodiment of the present disclosure may have identification information (for example, an MAC address) about where result values of the random number generator do not overlap. Accordingly, the monitor nodes 200-N may respectively input their own identification information to the random number generator to generate different delay times.

Each of the monitor nodes 200-N may not input all of identification information as a seed to the random number generator and may input only a portion of identification information as a seed to the random number generator to generate a delay time. For example, the monitor node 200-N may input, to the random number generator as a seed, some bits (for example, 8 bits) corresponding to a former part of a total MAC address which is identification information, some bits (for example, 8 bits) corresponding to a latter part of the total MAC address, or some bits corresponding to a middle part of a total MAC address, thereby generating a delay time. When a portion of identification information is used as a seed, the monitor node 200-N may be selected so that some of the identification information do not overlap and may be added to the wireless battery management system.

The reason that the monitor nodes 200-N generate different delay times is because, in a state where a dedicated slot is not yet assigned to each of the monitor nodes 200-N, when the monitor nodes 200-N transmits a response to the manager node 100 simultaneously, a response collision therebetween may occur. In an embodiment of the present disclosure, in order to prevent a response collision (i.e., a transmission collision) between the monitor nodes 200-N, the monitor nodes 200-N may generate different delay times. To provide description with reference to FIG. 3, it is described that a delay time is shortened in the order of the monitor node #1 200-1, the monitor node #2 200-2, the monitor node #3 200-3, and the monitor node #4 200-4.

When the generated delay time elapses, each of the monitor nodes 200-N may transmit a response, including its own identification information (for example, an MAC address), to the manager node 100 in operations S317, S319, S321, and S323. The response may represent that each of the monitor nodes 200-N joins in a short-range wireless network formed by the manager node 100. In FIG. 3, as a delay time is shortened in the order of the monitor node #1 200-1, the monitor node #2 200-2, the monitor node #3 200-3, and the monitor node #4 200-4, a response may be transmitted to the manager node 100 in the order of the monitor node #1 200-1, the monitor node #2 200-2, the monitor node #3 200-3, and the monitor node #4 200-4, thereby preventing a transmission collision between the monitor nodes 200-N.

Subsequently, in operation S325, the manager node 100 may check the number of responses received from the monitor nodes 200-N and the order of responses of the monitor nodes 200-N. The manager node 100 may check the number of monitor nodes 200-N joining in the short-range wireless network, based on the number of received responses. Subsequently, in operation S327, the manager node 100 may equally divide a transmission slot, assigned to a data frame, into slots equal to the number of responses (i.e., the number of monitor nodes) to generate a plurality of dedicated slots for the monitor nodes 200-N.

Subsequently, in operation S329, the manager node 100 may individually assign the plurality of dedicated slots to the monitor nodes 200-N so that a time sequence (i.e., an arrangement sequence) of the plurality of dedicated slots matches a response time sequence of the monitor nodes 200-N. Also, the manager node 100 may assign a communication ID, having a small digit or a character string in the sequence of an early response to a late response, to each of the monitor nodes 200-N. To describe an example with reference to FIG. 2, the manager node 100 may divide a transmission slot into four slots, assign a dedicated slot M1 of a first period to the monitor node #1 200-1 which has first responded, and assign a digit '1' as a communication ID to the monitor node #1 200-1. The manager node 100 may assign a dedicated slot M2 of a second period to the monitor node #2 200-2 which has second responded and may assign a digit '2' as a communication ID to the monitor node #2 200-2. Also, the manager node 100 may assign a dedicated slot M3 of a third period to the monitor node #3 200-3 which has third responded and may assign a digit '3' as a communication ID to the monitor node #3 200-3. Also, the manager node 100 may assign a dedicated slot M4 of a fourth period to the monitor node #4 200-4 which has latest responded and may assign a digit '4' as a communication ID to the monitor node #4 200-4.

The manager node 100 may map identification information about the monitor node 200-N, an assigned communication ID, and a response sequence and may record the mapped data in a join list. Also, the manager node 100 may transmit assignment information including dedicated slot information and a communication ID to a corresponding monitor node 200-N during a manager slot in operations S331, S333, S335, and S337. The manager node 100 may add a start point and an end point of a dedicated slot, assigned to the corresponding monitor node 200-N, to the dedicated slot information, or may add the number of divisions and assignment position (for example, an $n^{th}$ position) of a transmission slot to the dedicated slot information.

Subsequently, the monitor nodes 200-N may check a communication ID and dedicated slot information among assignment information received from the manager node 100, and then, may set the communication ID to its own ID and may set a period, corresponding to the dedicated slot information, of a total period of a transmission slot to its own dedicated slot in operations S339, S341, S343, and S345. When the dedicated slot information includes a start point and an end point, the monitor node 200-N may set a period, corresponding to the start point and the end point, of the total period of the transmission slot to its own dedicated slot. In another embodiment, when the dedicated slot information includes the number of divisions and assignment position of the transmission slot, the monitor node 200-N may equally divide the transmission slot into periods equal to the number of divisions, and then, may set a period, corresponding to the assignment position among the divided periods, to its own dedicated slot.

Subsequently, the monitor nodes 200-N may obtain battery data from a battery module connected thereto and may transmit the obtained battery data to the manager node 100 during the set dedicated slot in operations S347, S349, S351, and S353. To describe an example with reference to FIG. 2, the monitor node #1 200-1 may transmit battery data to the manager node 100 during an M1 slot, the monitor node #2 200-2 may transmit battery data to the manager node 100 during an M2 slot, the monitor node #3 200-3 may transmit battery data to the manager node 100 during an M3 slot, and the monitor node #4 200-4 may transmit battery data to the manager node 100 during an M4 slot. Each of the monitor nodes 200-N may transmit a communication ID assigned thereto and the battery data to the manager node 100.

Then, the manager node 100 may store battery data sequentially received from each of the monitor nodes 200-N and may analyze the battery data to monitor a state of each battery module.

One or more of the monitor nodes 200-N joining in the short-range wireless network formed by the manager node 100 may deviate from the short-range wireless network. In this case, the manager node 100 may adjust a dedicated slot so that a dedicated slot having a longer length is assigned to the monitor nodes 200-N which are continuously joining in the short-range wireless network.

Figure 4:
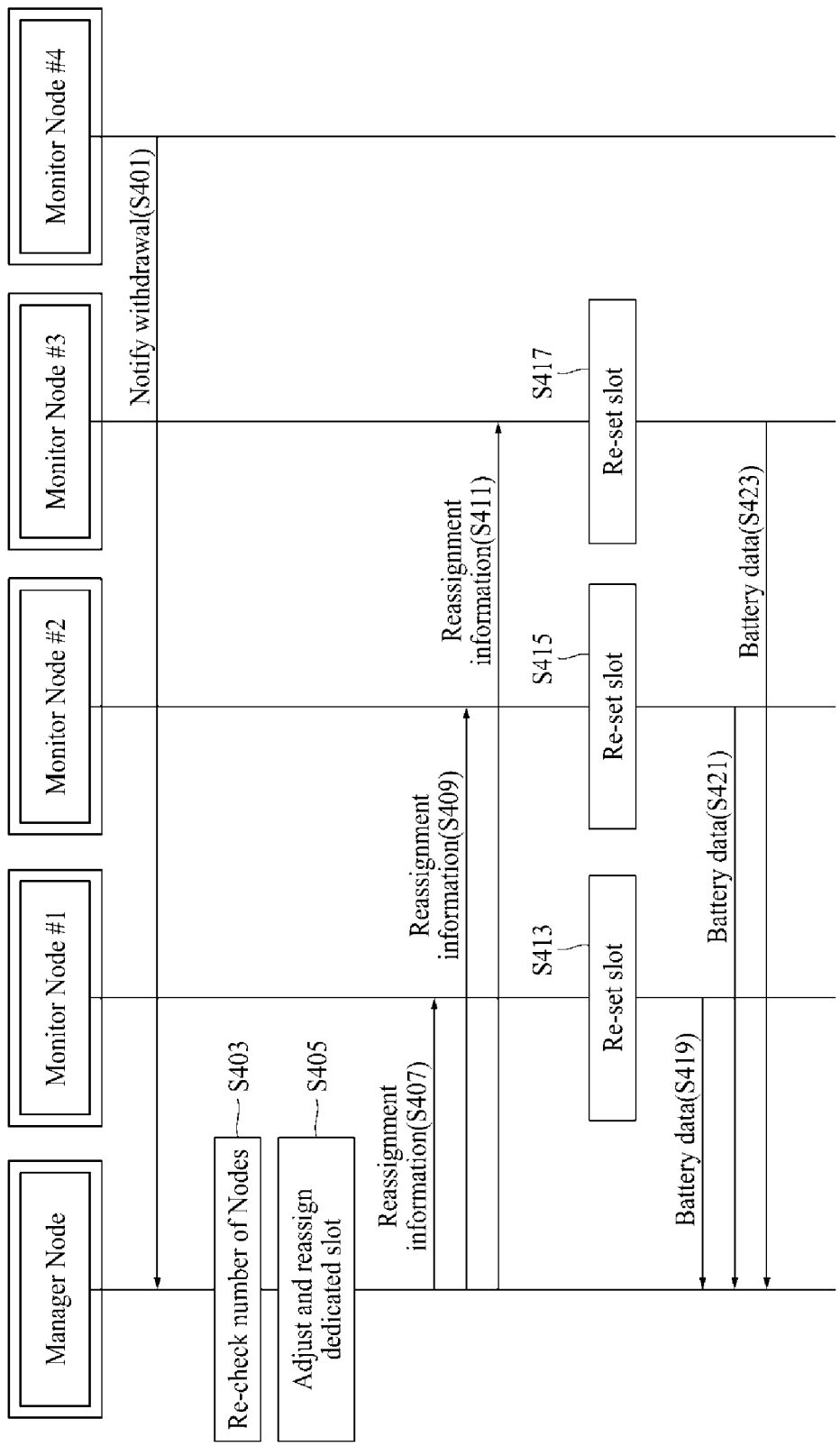
FIG. 4 is a flowchart describing a method of adjusting a dedicated slot when a specific monitor node deviates from a short-range wireless network, according to an embodiment of the present disclosure.

FIG. 4 is a flowchart describing a method of adjusting a dedicated slot when a specific monitor node deviates from a short-range wireless network, according to an embodiment of the present disclosure.

Figure 5:
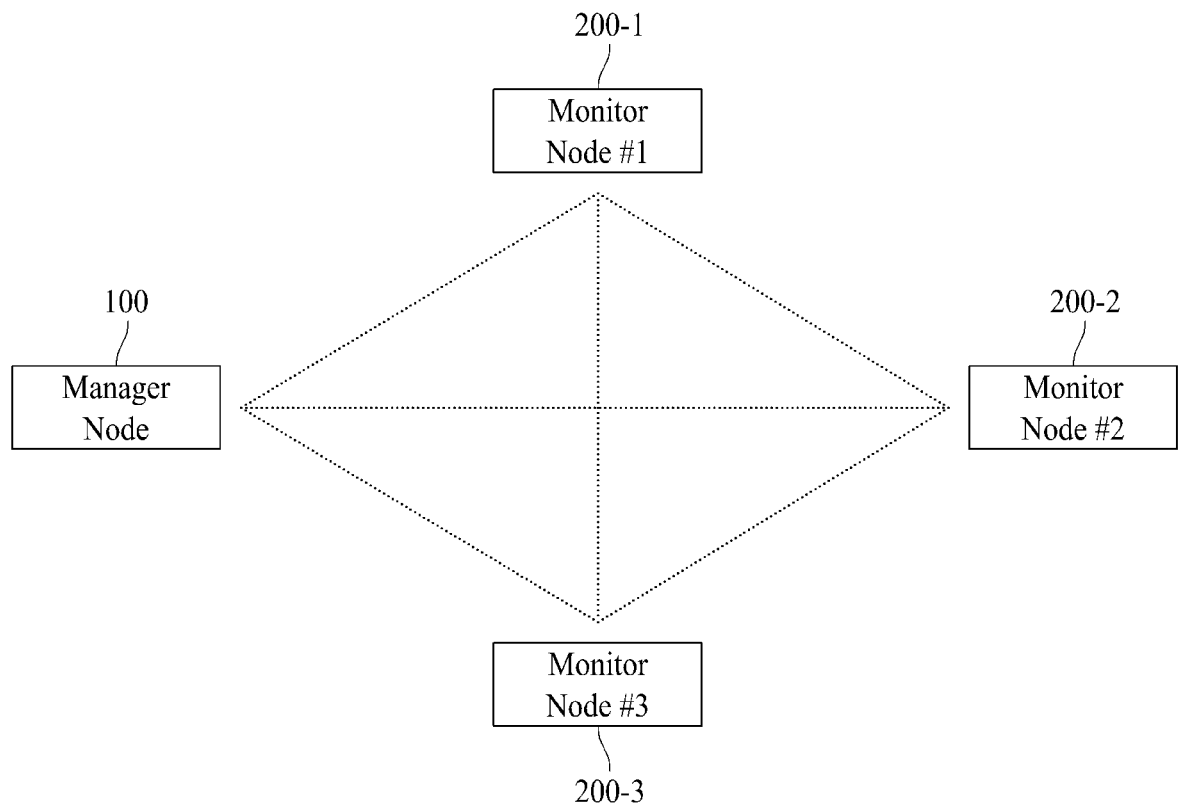
FIG. 5 is a diagram illustrating a state of a short-range wireless network after a monitor node #4 deviates therefrom, according to an embodiment of the present disclosure.

FIG. 5 is a diagram illustrating a state of a short-range wireless network after a monitor node #4 deviates therefrom, according to an embodiment of the present disclosure.

Referring to FIGS. 4 and 5, when it is determined that a monitor node #4 200-4 withdraws from the short-range wireless network, the monitor node #4 200-4 may transmit a withdrawal notification message including a communication ID to the manager node 100 in operation S401. When the monitor node #4 200-4 is removed from a battery management system or is replaced with another monitor node, the monitor node #4 200-4 may transmit the withdrawal notification message to the manager node 100. Also, the monitor node #4 200-4 may transmit the withdrawal notification message to the manager node 100 during a dedicated slot M4. When the monitor node #4 200-4 receives acknowledge (ACK) corresponding to the withdrawal notification message from the manager node 100, the monitor node #4 200-4 may disconnect a short-range wireless communication connection with the manager node 100 and may no longer transmit battery data to the manager node 100.

Based on the communication ID included in the withdrawal notification message, the manager node 100 may recognize the withdrawal of the monitor node #4 200-4 from the short-range wireless network and may remove data mapped to the communication ID from a join list, thereby updating the join list. In FIG. 4, it is illustrated that identification information, communication IDs, and response sequence of a monitor node #1 200-1, a monitor node #2 200-2, and a monitor node #3 200-3 are recorded in the updated join list.

Subsequently, when the join list is updated, the manager node 100 may re-check the number of monitor nodes in the join list to check the number of monitor nodes which is currently joining in the short-range wireless network in operation S403. Subsequently, the manager node 100 may adjust a dedicated slot so that a period of a dedicated slot assigned to the monitor node #4 200-4 is divided into a dedicated slot of each of the monitor node #1 200-1, the monitor node #2 200-2, and the monitor node #3 200-3, and thus, the dedicated slot of each of the monitor node #1 200-1, the monitor node #2 200-2, and the monitor node #3 200-3 extends. Also, in operation S405, the manager node 100 may reassign the adjusted dedicated slot to each of the monitor node #1 200-1, the monitor node #2 200-2, and the monitor node #3 200-3. That is, the manager node 100 may initialize a transmission slot to a before-division state and may divide the initialized transmission slot into periods equal to the number (for example, three) of re-checked monitor nodes to generate a plurality of dedicated slots. Also, the manager node 100 may assign the divided dedicated slot to each of the monitor node #1 200-1, the monitor node #2 200-2, and the monitor node #3 200-3 so that a response sequence recorded in the join list matches a time sequence of the divided dedicated slot.

Figure 6:
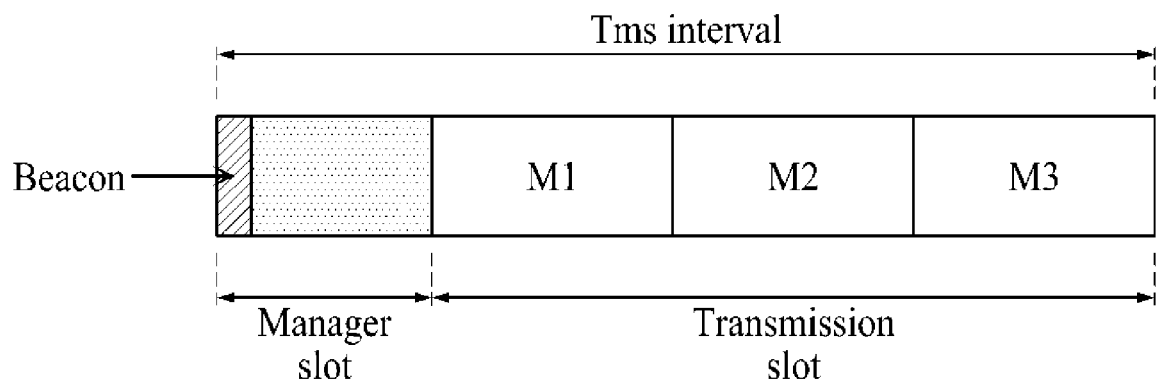
FIG. 6 is a diagram illustrating a data frame where a dedicated slot has extended.

FIG. 6 is a diagram illustrating a data frame where a dedicated slot has extended.

In FIG. 6, a monitor node #4 200-4 withdraws from a short-range wireless network, and thus, a transmission slot is divided into dedicated slots M1, M2, and M3 of a monitor node #1 200-1, a monitor node #2 200-2, and a monitor node #3 200-3. Comparing a data frame of FIG. 6 with the data frame of FIG. 2, the dedicated slots M1, M2, and M3 included in the data frame of FIG. 6 are in an extended state compared to the dedicated slots M1, M2, and M3 of FIG. 2.

When reassignment of a dedicated slot is completed, the manager node 100 may transmit reassignment information, including information about a reassigned dedicated slot, to a corresponding monitor node 200-N in operations S407, S409, and S411. The manager node 100 may add a start point and an end point of the reassigned dedicated slot to the dedicated slot information, or may add the number of divisions of the reassigned transmission slot and a position (for example, an $n^{th}$ position) of the reassigned dedicated slot to the dedicated slot information.

Then, each of the monitor nodes 200-N may check the dedicated slot information among the reassignment information and may re-set a period, corresponding to the dedicated slot information, of the transmission slot to its own dedicated slot in operations S413, S415, and S417. Subsequently, each of the monitor nodes 200-N may obtain battery data from a battery module connected thereto and may transmit the obtained battery data and a communication ID to the manager node 100 during the re-set dedicated slot in operations S419, S421, and S423.

Subsequently, the manager node 100 may store battery data sequentially received from each of the monitor nodes 200-N and may analyze the battery data to monitor a state of each battery module.

One or more new monitor nodes may join in the short-range wireless network formed by the manager node 100. In this case, the manager node 100 may adjust a dedicated slot of each of the monitor nodes 200-N currently joining therein so that a dedicated slot is assigned to the new monitor nodes.

Figure 7:
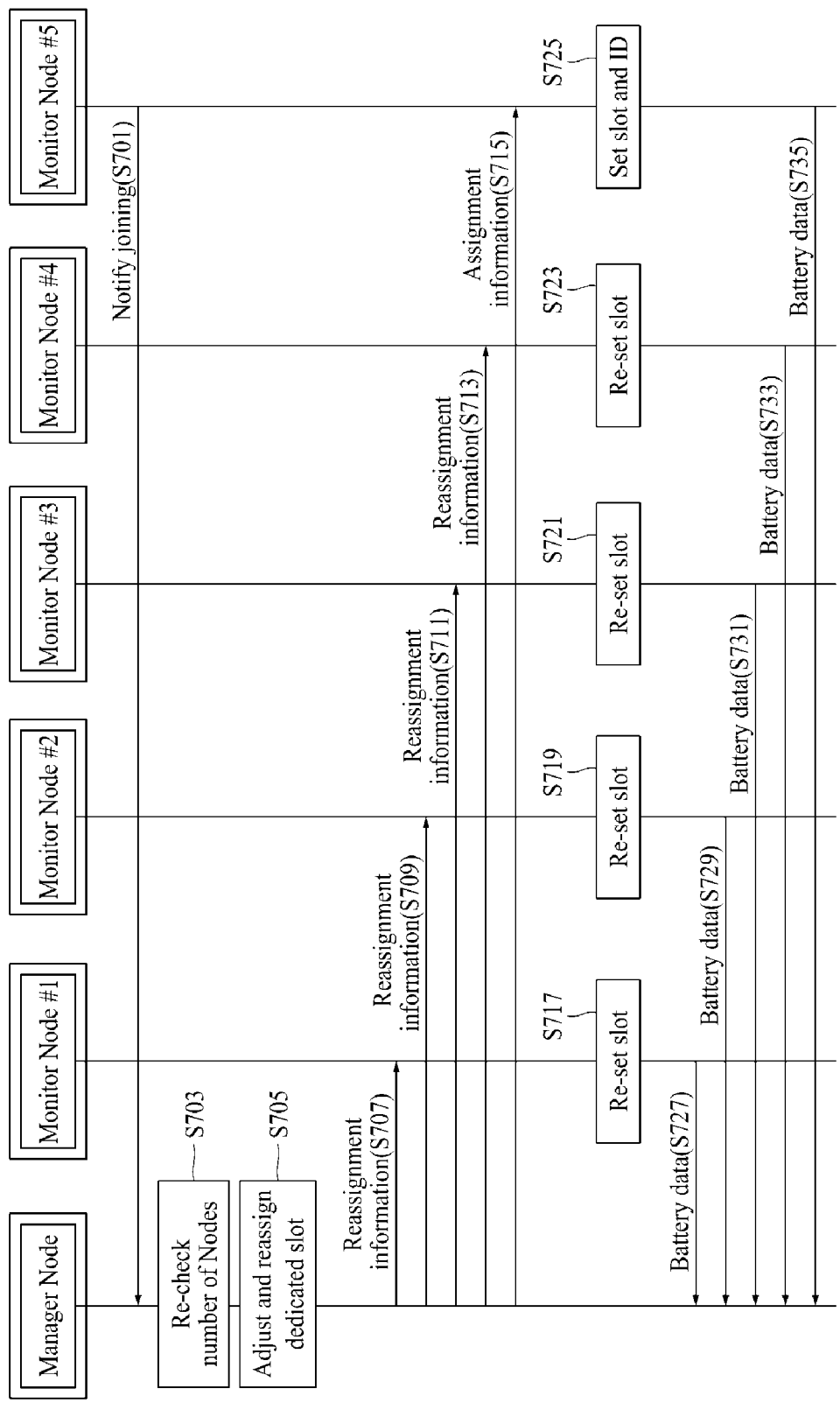
FIG. 7 is a flowchart describing a method of adjusting a dedicated slot when a new monitor node joins in a short-range wireless network, according to an embodiment of the present disclosure.

FIG. 7 is a flowchart describing a method of adjusting a dedicated slot when a new monitor node joins in a short-range wireless network, according to an embodiment of the present disclosure.

Figure 8:
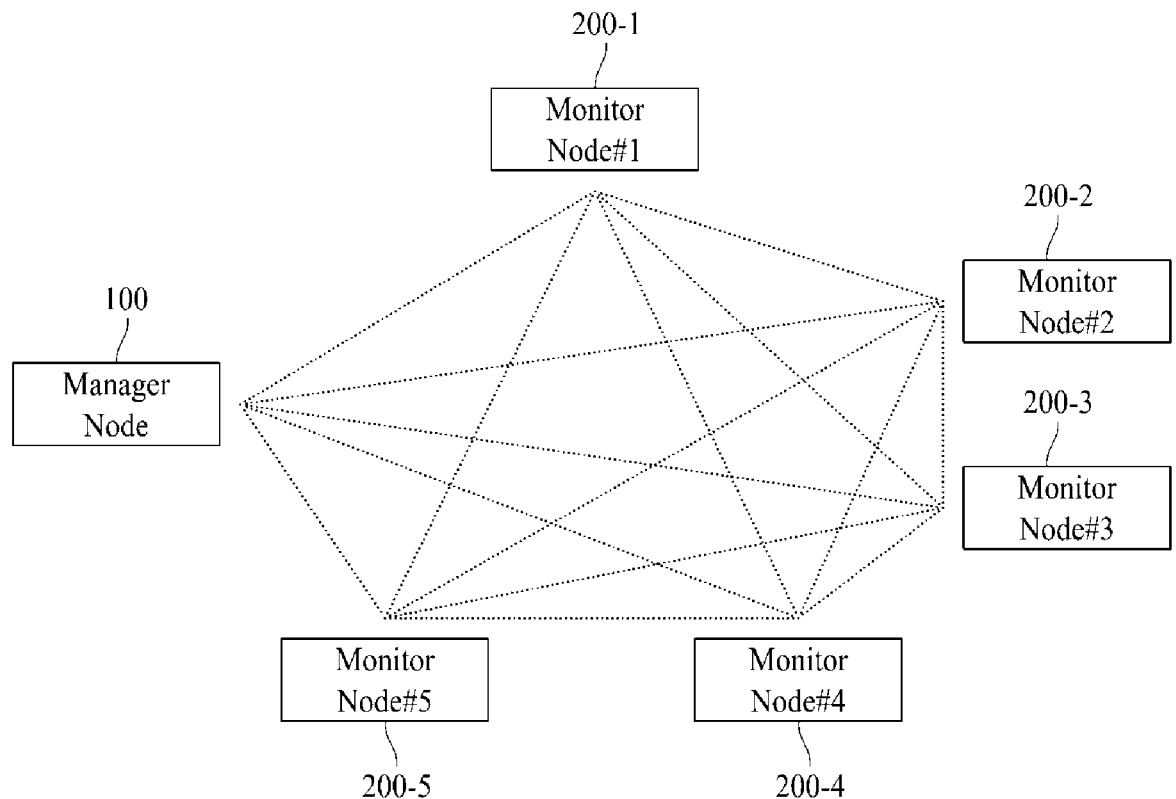
FIG. 8 is a diagram illustrating a state of a short-range wireless network after a monitor node #5 joins therein, according to an embodiment of the present disclosure.

FIG. 8 is a diagram illustrating a state of a short-range wireless network after a monitor node #5 joins therein, according to an embodiment of the present disclosure.

FIG. 7 illustrates a method which is performed after the process of FIG. 3.

Referring to FIGS. 7 and 8, a monitor node #5 200-5 may transmit a join notification message including its own identification information (for example, an MAC address) to a manager node 100 in operation S701. At this time, the monitor node #5 200-5 may transmit the join notification message to the manager node 100 at a time when a data collision does not occur, based on carrier sense multiple access with collision avoidance (CSMA/CA). In a case where a new battery module is additionally provided and the monitor node #5 200-5 is equipped in the new battery module, the monitor node #5 200-5 may transmit the join notification message to the manager node 100.

Subsequently, as the monitor node #5 200-5 newly joins in a short-range wireless network, the manager node 100 may assign a communication ID of the monitor node #5 200-5 and may set a response sequence of the monitor node #5 200-5 to a last response sequence. Also, the manager node 100 may map the communication ID, identification information, and set response sequence of the monitor node #5 200-5 and may newly store mapped data in a join list.

As the join list is updated, the manager node 100 may re-check the number of monitor nodes joining in the short-range wireless network in operation S703. Subsequently, in order to assign a dedicated slot to the newly-joined monitor node #5 200-5, the manager node 100 may adjust slots so that a dedicated slot of each of a monitor node #1 200-1, a monitor node #2 200-2, a monitor node #3 200-3, and a monitor node #4 200-4 is reduced and may newly assign a dedicated slot of the monitor node #5 200-5 in operation S705. That is, the manager node 100 may initialize a transmission slot to a before-division state and may divide the initialized transmission slot into periods equal to the number (for example, five) of re-checked monitor nodes to generate a plurality of dedicated slots. Also, the manager node 100 may assign the divided dedicated slot to each of the monitor node #1 200-1, the monitor node #2 200-2, the monitor node #3 200-3, the monitor node #4 200-4, and the monitor node #5 200-5 so that a response sequence recorded in the join list matches a time sequence of the divided dedicated slot.

Figure 9:
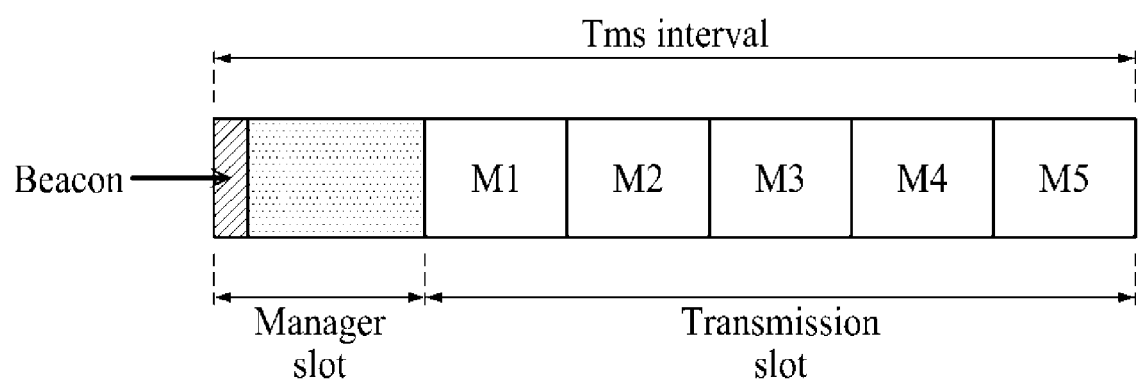
FIG. 9 is a diagram illustrating a data frame where a dedicated slot is reduced.

FIG. 9 is a diagram illustrating a data frame where a dedicated slot is reduced.

In FIG. 9, as a monitor node #5 200-5 joins newly, a transmission slot is divided into dedicated slots of a monitor node #1 200-1, a monitor node #2 200-2, a monitor node #3 200-3, a monitor node #4 200-4, and a monitor node #5 200-5. Comparing a data frame of FIG. 9 with the data frame of FIG. 2, dedicated slots M1, M2, M3, and M4 included in the data frame of FIG. 9 are in a reduced state compared to the dedicated slots M1, M2, M3, and M4 of FIG. 2.

When reassignment of a dedicated slot is completed, the manager node 100 may transmit reassignment information, including information about a reassigned dedicated slot, to each of corresponding monitor node #1 200-1, monitor node #2 200-2, monitor node #3 200-3, and monitor node #4 200-4 in operations S707, S709, S711, and S713. Also, the manager node 100 may transmit assignment information, including a communication ID and dedicated slot information of the monitor node #5 200-5, to the monitor node #5 200-5 in operation S715. The manager node 100 may transmit the reassignment information or the assignment information to a corresponding monitor node during a manager slot.

Then, each of the monitor node #1 200-1, the monitor node #2 200-2, the monitor node #3 200-3, and the monitor node #4 200-4 may check the dedicated slot information among the reassignment information received thereby and may re-set a period, corresponding to the dedicated slot information, of a total period of the transmission slot to its own dedicated slot in operations S717, S719, S721, and S723. Also, the monitor node #5 200-5 may check a communication ID and dedicated slot information among the assignment information received from the manager node 100, set the communication ID to its own ID, and set a period, corresponding to the dedicated slot information, of the transmission slot to a dedicated slot of the monitor node #5 200-5 in operation S725.

Subsequently, each of the monitor nodes 200-N may obtain battery data and may transmit the obtained battery data and a communication ID to the manager node 100 during its own dedicated slot in operations S727, S729, S731, S733, and S735.

Subsequently, the manager node 100 may store battery data sequentially received from each of the monitor nodes 200-N and may analyze the battery data to monitor a state of each battery module.

Figure 10:
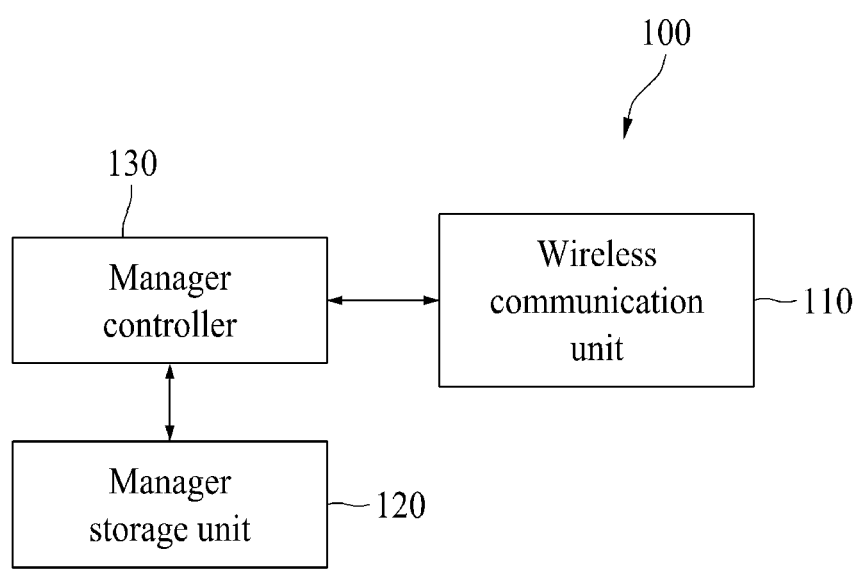
FIG. 10 is a diagram illustrating a configuration of a manager node, according to an embodiment of the present disclosure.

FIG. 10 is a diagram illustrating a configuration of a manager node 100 according to an embodiment of the present disclosure.

As illustrated in FIG. 10, the manager node 100 according to an embodiment of the present disclosure may include a wireless communication unit 110, a manager storage unit 120, and a manager controller 130.

The wireless communication unit 110 may include a radio frequency (RF) circuit for performing short-range wireless communication. Also, the wireless communication unit 110 may broadcast a beacon at certain periods. Also, the wireless communication unit 110 may form a short-range wireless network along with one or more monitor nodes 200-N. The wireless communication unit 110 may transmit a message or data to the monitor node 200-N during a manager slot. Also, the wireless communication unit 110 may receive battery data from each of the monitor nodes 200-N during a transmission slot.

The manager storage unit 120 may be a storage means such as a disk device or a memory and may store various programs and data for operating the manager node 100. The manager storage unit 120 may store a program (or an instruction set) for executing an operation of the manager node 100. The manager storage unit 120 may store a join list where a communication ID, identification information (for example, an MAC address), and a response sequence of the identification information of each of the monitor nodes 200-N are mapped. Also, the manager storage unit 120 may store battery data received from each of the monitor nodes 200-N.

The manager controller 130, an operational processing device such as a microprocessor, may control an overall operation of the manager node 100 and may generate data for controlling the monitor nodes 200-N. The manager controller 130 may store data, associated with the program (or the instruction set) stored in the manager storage unit 120, in a memory and may perform an operation of assigning and adjusting a dedicated slot according to an embodiment of the present disclosure.

The manager controller 130 may obtain the battery data of each monitor nodes 200-N by using wireless communication unit 110 and may analyze the battery data to check states of battery modules including the monitor node 200-N. Also, the manager controller 130 may overall analyze the battery data to check a state of a battery pack and may control charging and discharging, based thereon.

According to an embodiment of the present disclosure, the manager controller 130 may count the number of monitor nodes 200-N joining in the short-range wireless network and may divide a transmission slot into periods equal to the number of monitor nodes 200-N to generate a number of dedicated slots equal to the number of monitor nodes 200-N. At this time, the manager controller 130 may broadcast a message for requesting identification information and issuing a request to join in the short-range wireless network and may count the number of monitor nodes 200-N responding thereto, thereby checking the number of monitor nodes 200-N joining in the short-range wireless network. The manager node 100 may assign each of the dedicated slots to the monitor node 200-N so that a time sequence (i.e., an arrangement sequence) of the generated one or more dedicated slots matches a response sequence of the monitor node 200-N and may assign a communication ID, having a small digit or a character string in the sequence of an early response to a late response, to the monitor node 200-N. Also, when the number of monitor nodes 200-N joining in the short-range wireless network is changed, the manager controller 130 may adjust a length of each of previously assigned dedicated slots and may reassign a length-adjusted dedicated slot to each of the monitor nodes 200-N.

Figure 11:
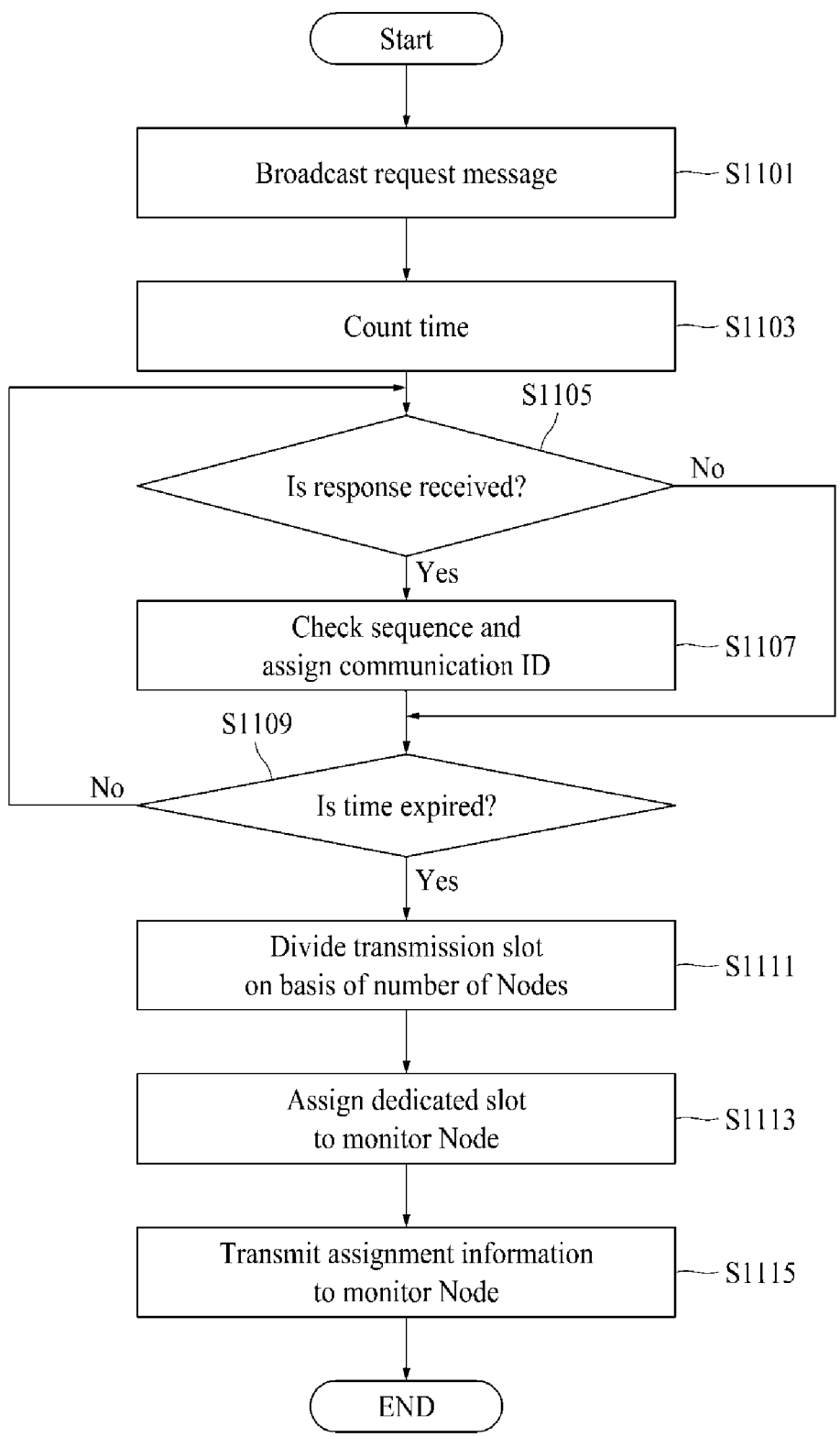
FIG. 11 is a flowchart a method of assigning a dedicated slot to a monitor node by using a manager node, according to an embodiment of the present disclosure.

FIG. 11 is a flowchart a method of assigning a dedicated slot to a monitor node by using a manager node, according to an embodiment of the present disclosure.

Referring to FIG. 11, when a network is initially set, the manager controller 130 may broadcast a message for issuing a request to join in the network and requesting identification information by using the wireless communication unit 110 and may start to count a time in operations S1101 and S1103. The manager controller 130 may add an ID of a short-range wireless network, formed by the manager node 100, to the message and may broadcast the message. The ID of the short-range wireless network may be set in a process of releasing a product and may be stored in the manager storage unit 120. Also, the manager node 100 may broadcast the message during a manager slot.

Subsequently, in operation S1105, the manager controller 130 may monitor whether the wireless communication unit 110 receives a join response from a monitor node 200-N. When the join response is received, the manager controller 130 may check a join response sequence and identification information (for example, an MAC address) of a corresponding monitor node 200-N and may assign a communication ID of the monitor node 200-N in S1107. Also, the manager controller 130 may map the assigned communication ID, a response sequence, and the identification information about the monitor node 200-N and may record mapped data in a join list.

The manager controller 130 may check whether a counted time reaches a predetermined expiration time, and when the counted time does not reach the predetermined expiration time in operation S1109 (No), the manager controller 130 may again perform operation S1105 to stand by the reception of a response.

On the other hand, when the counted time reaches the predetermined expiration time in operation S1109 (Yes), the manager controller 130 may check the number of monitor nodes recorded in the join list and may divide a transmission slot into periods equal to the number of monitor nodes to generate a number of dedicated slots equal to the number of monitor nodes. Subsequently, the manager controller 130 may assign each of the dedicated slots to the monitor node 200-N so that a time sequence of the generated dedicated slot matches a response sequence of the monitor node 200-N. Also, the manager controller 130 may generate assignment information including dedicated slot information and a communication ID for each monitor node 200-N and may transmit the assignment information to a corresponding monitor node 200-N by using the wireless communication unit 110 in operation S1115. At this time, the manager controller 130 may add a start point and an end point of a dedicated slot to the dedicated slot information, or may add the number of divisions and assignment position (for example, an $n^{th}$ position) of a transmission slot to the dedicated slot information.

Figure 12:
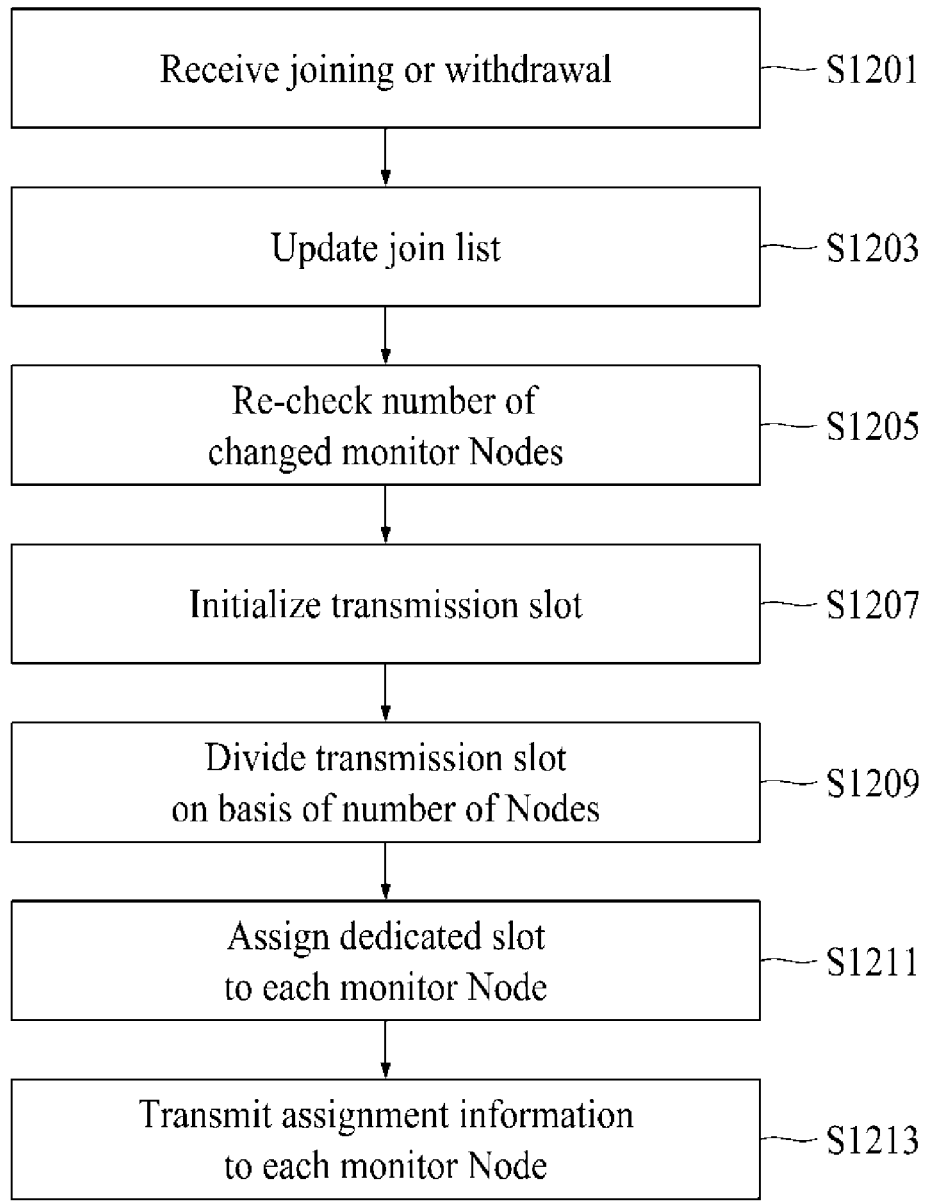
FIG. 12 is a flowchart describing a method of adjusting a dedicated slot on the basis of a change in the number of monitor nodes by using a manager node, according to an embodiment of the present disclosure.

FIG. 12 is a flowchart describing a method of adjusting a dedicated slot on the basis of a change in the number of monitor nodes by using a manager node, according to an embodiment of the present disclosure.

Referring to FIG. 12, the wireless communication unit 110 may receive a join request message or a withdrawal notification message from a monitor node 200-N in operation S1201. Subsequently, the manager controller 130 may recognize that a new monitor node 200-N joins in a network or a previous monitor node 200-N withdraws from the network and may update a join list in operation S1203. In detail, when the wireless communication unit 110 receives the withdrawal notification message, the manager controller 130 may check a communication ID in the withdrawal notification message and may delete data, mapped to the communication ID, from the join list. Also, when the wireless communication unit 110 receives the join request message, the manager controller 130 may check identification information about the new monitor node 200-N in the join request message and may assign a communication ID of the new monitor node 200-N. Also, the manager controller 130 may latest set a response sequence of the new monitor node 200-N, and then, may map the identification information, communication ID, and response sequence of the new monitor node 200-N and may newly store mapped data in the join list.

When the join list is updated, the manager controller 130 may check the number of changed monitor nodes in the join list in operation S1205. Subsequently, the manager controller 130 may initialize the transmission slot to a before-division state in operation S1207 and may redivide the initialized transmission slot into periods equal to the checked number of monitor nodes to re-generate a dedicated slot in operation S1209.

Moreover, the manager controller 130 may reassign the generated dedicated slot to each of the monitor nodes 200-N so that a response sequence recorded in the join list matches a time sequence (an arrangement sequence) of the generated dedicated slot in operation S1211. Subsequently, the manager controller 130 may generate reassignment information including information about a reassigned dedicated slot for each monitor node 200-N and may transmit the reassignment information to a corresponding monitor node 200-N by using the wireless communication unit 110 in operation S1213. At this time, the manager controller 130 may transmit the reassignment information to the monitor node 200-N during a manager slot. Also, the manager controller 130 may add a start point and an end point of the reassigned dedicated slot to the dedicated slot information, or may add the number of divisions and assignment position (for example, an $n^{th}$ position) of a transmission slot to the dedicated slot information.

Figure 13:
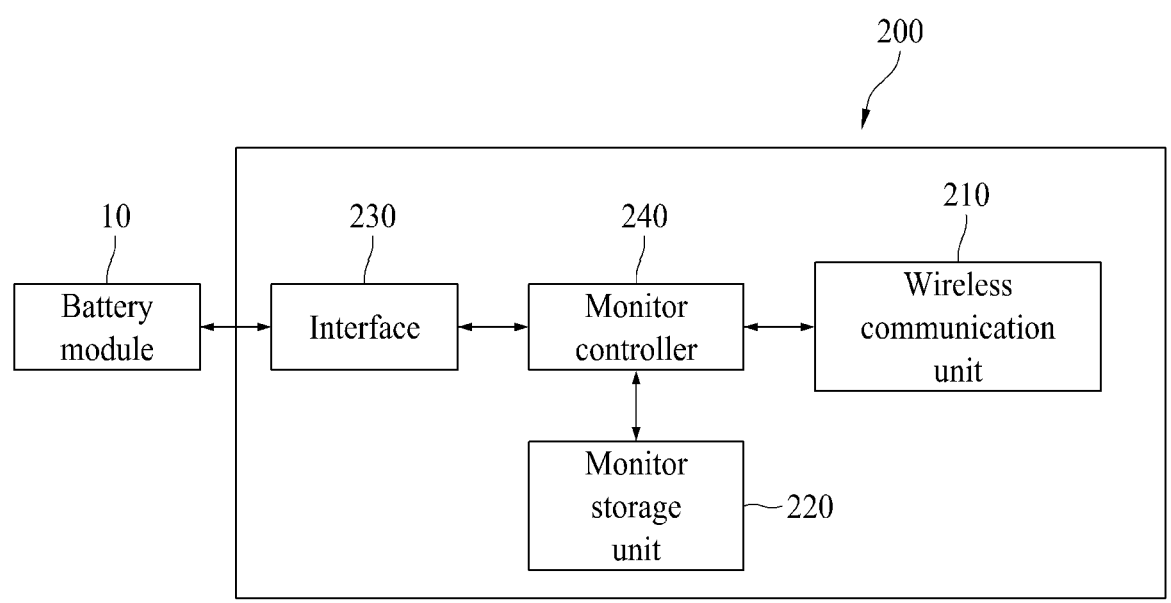
FIG. 13 is a diagram illustrating a configuration of a monitor node according to an embodiment of the present disclosure.

FIG. 13 is a diagram illustrating a configuration of a monitor node 200 according to an embodiment of the present disclosure.

As illustrated in FIG. 13, the manager node 200 according to an embodiment of the present disclosure may include a wireless communication unit 210, a monitor storage unit 220, an interface 230, and a monitor controller 240.

The wireless communication unit 210 may perform short-range wireless communication with a manager node 100. The wireless communication unit 210 may receive data from the manager node 100 during a manager slot and may transmit battery data to the manager node 100 during dedicated slot of the monitor node 200.

The monitor storage unit 220 may be a storage means such as a disk device or a memory and may store various programs and data for operating the monitor node 200. Particularly, the monitor storage unit 220 may store a program (or an instruction set) for executing an operation of the monitor node 200. Also, the monitor node 220 may store a network list where one or more pieces of short-range wireless network identification information accessible by the monitor node 200 are recorded.

The interface 230 may be an element which supports a communication connection with a battery module 10 equipped with the monitor node 200 and may use a bus cable, a cable, or the like, or may use CAN communication. The monitor node 200 may obtain, through the interface 230, battery data generated in the battery module 10.

The monitor controller 240, an operational processing device such as a microprocessor, may control an overall operation of the monitor node 200. The monitor controller 240 may store data, associated with the program (or the instruction set) stored in the monitor storage unit 220, in a memory, and then, may transmit a response message according to an embodiment of the present disclosure to the manager node 100 and may set a dedicated slot and a communication ID.

When the wireless communication unit 210 receives a join request message from the manager node 100, the monitor controller 240 may input a portion or all of identification information about the monitor node to a random number generator to generate a delay time which differs from other monitor nodes, and after the delay time elapses, the monitor controller 240 may transmit a join response to the manager node 100 by using the wireless communication unit 210. The monitor controller 240 may obtain various data such as a temperature, a current, humidity, and a voltage of a battery module 10 through the interface 230 and may perform a diagnostic test such as the analog-front-end (AFE) measurement and state test (i.e., a diagnostic test) of the battery module 10. Also, the monitor controller 240 may set a dedicated slot and a communication ID of the monitor node 200 on the basis of assignment information received from the manager node 100. The monitor controller 240 may control the wireless communication unit 210 to transmit battery data, including one or more of a voltage, a current, humidity, a temperature, and diagnostic test data, to the manager node 100 during the set dedicated slot.

Figure 14:
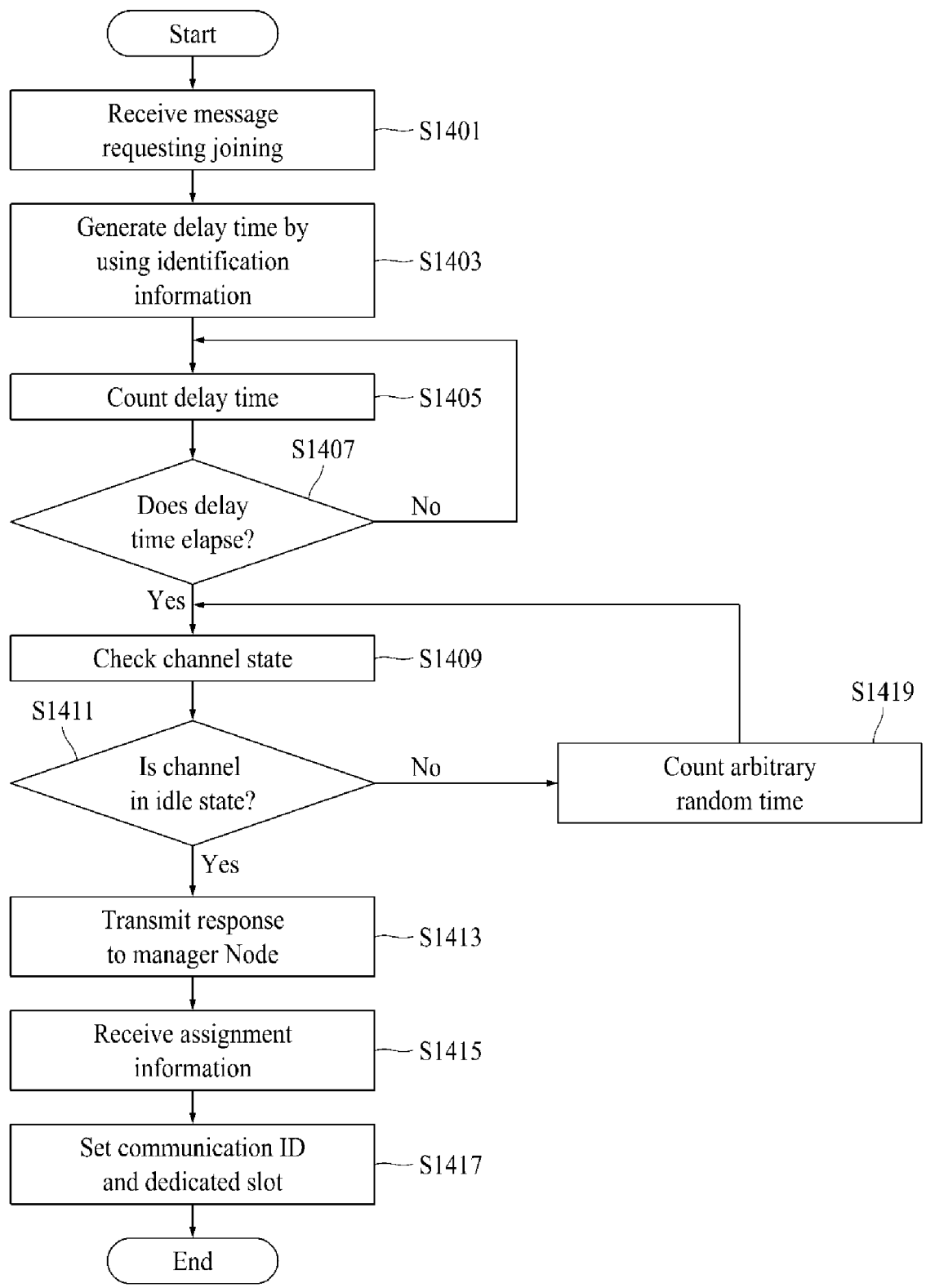
FIG. 14 is a flowchart describing a method of setting a communication identification (ID) and a dedicated slot by using a monitor node, according to an embodiment of the present disclosure.

FIG. 14 is a flowchart describing a method of setting a communication ID and a dedicated slot by using a monitor node, according to an embodiment of the present disclosure.

Referring to FIG. 14, the wireless communication unit 210 of the monitor node 200 may receive a message, which includes a short-range wireless network ID, requests identification information, and issues a request to join in a network, from the manager node 100 in operation S1401.

Subsequently, the monitor controller 240 may compare the short-range wireless network ID with an ID of a network list of the monitor storage unit 220 to determine whether a short-range wireless network formed by the manager node 100 is a join-enabled network. That is, the monitor controller 240 may check whether the short-range wireless network ID is recorded in the network list. When the short-range wireless network ID is not recorded in the network list, the monitor controller 240 may determine that it is unable to join in the short-range wireless network formed by the manager node 100 and may not transmit a response message to the manager node 100.

On the other hand, when the short-range wireless network ID is included in the network list, the monitor controller 240 may start a process of joining in the short-range wireless network. First, the monitor controller 240 may input, as a seed, a portion or all of identification information (for example, an MAC address) about the monitor node 200 to the random number generator to generate a delay time which differs from another monitor node 200 in operation S1403. Subsequently, the monitor controller 240 may count the delay time in operation S1405, and when the delay time elapses in operation S1407 (Yes), the monitor controller 240 may check, by using the wireless communication unit 210, whether a state of a channel formed by the manager node 100 is a busy state or an idle state in operation S1409. The channel state may be unstable due to a short delay time difference between a delay time of the monitor node 200 and a delay time of the other monitor node or may be unstable due to an ambient environment, and thus, the monitor controller 240 may check a channel state corresponding to the manager node 100. The monitor controller 240 may check whether the channel state is the idle state or the busy state, based on a clear channel assignment (CCA) mode. That is, the monitor controller 240 may perform an operation of detecting energy of the channel by using the wireless communication unit 210, and when an energy detection result value is greater than a predetermined threshold value, the monitor controller 240 may determine that the channel state is the busy state. Also, when the energy detection result value is equal to or less than the predetermined threshold value, the monitor controller 240 may determine that the channel state is the idle state. Also, the monitor controller 240 may perform a carrier sensing operation by using the wireless communication unit 210, and then, when carriers equal to or more than a reference level are detected, the monitor controller 240 may determine that the channel state is the busy state, and otherwise, the monitor controller 240 may determine that the channel state is the idle state.

When the channel is in the idle state in operation S1411 (Yes), the monitor controller 240 may generate a join response message including identification information about the monitor node 200 and may transmit the join response message to the manager node 100 by using the wireless communication unit 210 in operation S1413.

Subsequently, after transmitting the join response message, the wireless communication unit 210 may receive assignment information from the manager node 100 in operation S1415, and the monitor controller 240 may check dedicated slot information and a communication ID among the assignment information. Also, the monitor controller 240 may set the checked communication ID to a communication ID of the monitor node 200 and may set a period, corresponding to the dedicated slot information, of a total period of a transmission slot to a dedicated slot of the monitor node 200 in operation S1417. When the dedicated slot information includes a start point and an end point, the monitor controller 240 may set a period, corresponding to the start point and the end point, of the total period of the transmission slot to the dedicated slot of the monitor node 200. In another embodiment, when the dedicated slot information includes the number of divisions and assignment position of the transmission slot, the monitor controller 240 may divide the transmission slot on the basis of the number of divisions and may set a period, corresponding to the assignment position among divided periods, to the dedicated slot of the monitor node 200.

The monitor controller 240 may collect battery data, including one or more of a temperature, a voltage, a current, humidity, and diagnostic test data of the battery module 10 by using the interface 230 and may transmit the collected battery data and a communication ID to the manager node 100 during the set dedicated slot by using the wireless communication unit 210.

When the channel state is the busy state in operation S1411, the monitor controller 240 may generate a random time and may count the random time, and then, when the random time elapses, the monitor controller 240 may perform a process of re-checking the channel state in operation S1419. The random time may be an arbitrary time which is randomly selected within a predetermined time range (for example, 1 ms to 10 ms).

According to the embodiments of the present disclosure, a plurality of dedicated slots may be generated by dividing a transmission slot on the basis of the number of monitor nodes, and each of the dedicated slots may be individually assigned to a corresponding monitor node, thereby preventing wireless channel contention between the monitor nodes.

Moreover, according to the embodiments of the present disclosure, when the number of monitor nodes is changed, a dedicated slot included in a transmission slot may be dynamically adjusted based on the changed number of monitor nodes, and thus, the dedicated slot may be efficiently used and the wireless battery management system may be easily expanded.

Furthermore, according to the embodiments of the present disclosure, when a monitor node receives a joining request from a manager node, the monitor node may generate a delay time which differs from the other monitor nodes and may provide a response to the manager node at a time when a corresponding delay time elapses, thereby preventing the occurrence of a transmission collision in a responding process.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

All of the disclosed methods and procedures described in this disclosure can be implemented, at least in part, using one or more computer programs or components. These components may be provided as a series of computer instructions on any conventional computer readable medium or machine readable medium, including volatile and non-volatile memory, such as RAM, ROM, flash memory, magnetic or optical disks, optical memory, or other storage media. The instructions may be provided as software or firmware, and may be implemented in whole or in part in hardware components such as ASICs, FPGAs, DSPs, or any other similar devices. The instructions may be configured to be executed by one or more processors or other hardware components which, when executing the series of computer instructions, perform or facilitate the performance of all or part of the disclosed methods and procedures.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A wireless battery management system comprising:
    a manager node checking a number of monitor nodes joining in a short-range wireless network for battery management, dividing a transmission slot, assigned for data transmission, by the number of monitor nodes to generate a plurality of dedicated slots, and respectively assigning the plurality of dedicated slots to the monitor nodes; and
    a monitor node collecting battery data and transmitting the collected battery data to the manager node during an assigned dedicated slot,
    wherein, when the number of monitor nodes joining in the short-range wireless network is changed, the manager node adjusts the dedicated slot to extend or reduce the dedicated slot on the basis of a number of changed monitor nodes, and reassigns the adjusted dedicated slot to the monitor node.

2. The wireless battery management system of claim 1, wherein the manager node broadcasts a message issuing a request to join in the short-range wireless network and respectively assigns the plurality of dedicated slots to the monitor nodes in a response sequence corresponding to the message.

3. The wireless battery management system of claim 2, wherein the monitor node generates a delay time which differs from another monitor node, and after the generated delay time elapses, the monitor node transmits a response corresponding to the message to the manager node.

4. The wireless battery management system of claim 1, wherein,
    when the number of monitor nodes increases, the manager node reduces the dedicated slot, and
    when the number of monitor nodes decreases, the manager node extends the dedicated slot.

5. The wireless battery management system of claim 1, wherein,
    the monitor node transmits the battery data, and
    the battery data includes at least one of a temperature, a current, a voltage, or diagnostic test data of a battery module.

6. A manager node comprising:
a wireless communication unit forming a short-range wireless network along with a plurality of monitor nodes; and
a manager controller dividing a transmission slot, assigned for data transmission, by a number of monitor nodes to generate a plurality of dedicated slots, respectively assigning the plurality of dedicated slots to the monitor nodes, and transmitting information about an assigned dedicated slot to a corresponding monitor node by using the wireless communication unit,
wherein, when the number of monitor nodes joining in the short-range wireless network is changed, the manager controller redivides the transmission slot on the basis of a number of changed monitor nodes to re-generate a dedicated slot, reassigns the re-generated dedicated slot to each monitor node, and transmits information about the reassigned dedicated slot to each monitor node by using the wireless communication unit.

7. The manager node of claim 6, wherein
the wireless communication unit broadcasts a message, issuing a request to join in the short-range wireless network, to each of the monitor nodes, and
the manager controller counts number of monitor nodes responding to the message to check the number of monitor nodes and respectively assigns the plurality of dedicated slots to the monitor nodes so that a time sequence of the plurality of dedicated slots matches a response sequence in which responses are received from the monitor nodes.

8. The manager node of claim 7, wherein the manager controller assigns a communication identification (ID) to each of the monitor nodes, maps identification information, a response sequence, and a communication ID of each monitor node, and records mapped data in a join list.

9. The manager node of claim 6, wherein the manager controller adds a start point and an end point of a corresponding dedicated slot to information about the corresponding dedicated slot.

10. The manager node of claim 6, wherein the manager controller adds number of divisions and an assignment position of the transmission slot to information about the corresponding dedicated slot.

11. A monitor node comprising:
a wireless communication unit receiving a message, issuing a request to join in a short-range wireless network, from a manager node; and
a monitor controller generating a delay time, transmitting a join response to the manager node by using the wireless communication unit after the delay time elapses, and checking assignment information received from the manager node to set a dedicated slot for battery data transmission,
wherein the monitor controller checks a channel state corresponding to the manager node after the delay time elapses, and when the channel state is an idle state, the monitor controller controls the wireless communication unit to transmit the join response to the manager node.

12. The monitor node of claim 11, further comprising an interface connected to a battery module,
wherein the monitor controller collects battery data, by using the interface and controls the wireless communication unit to transmit the collected battery data to the manager node during the dedicated slot, and
the battery data is at least one of a voltage, a current, a temperature, humidity, or diagnostic test data of the battery module.

13. The monitor node of claim 11, wherein,
when the channel state is a busy state after the delay time elapses, the monitor controller generates a random time, and
after the random time elapses, the monitor controller re-checks the channel state, and when the channel state is the idle state, the monitor controller controls the wireless communication unit to transmit the join response to the manager node.

14. The monitor node of claim 11, wherein the monitor controller inputs, as a seed, identification information about the monitor node to a random number generator to generate the delay time.

* * * * *